(12) United States Patent
Chen et al.

(10) Patent No.: US 7,829,978 B2
(45) Date of Patent: Nov. 9, 2010

(54) CLOSED LOOP CESL HIGH PERFORMANCE CMOS DEVICE

(75) Inventors: Shang-Chih Chen, Jiadong Township (TW); Shih-Hsieng Huang, Renwu Township (TW); Chih-Hao Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 132 days.

(21) Appl. No.: 11/170,201

(22) Filed: Jun. 29, 2005

(65) Prior Publication Data

US 2007/0001217 A1 Jan. 4, 2007

(51) Int. Cl.
*H01L 23/58* (2006.01)

(52) U.S. Cl. .................. 257/635; 257/649; 257/900; 257/E29.132; 257/E29.162; 257/E29.165

(58) Field of Classification Search ................ 257/635, 257/649, 900, E29.132, E29.162, E29.165
See application file for complete search history.

(56) References Cited

U.S. PATENT DOCUMENTS

| | | | | |
|---|---|---|---|---|
| 6,764,966 B1* | 7/2004 | En et al. | ..................... | 438/785 |
| 6,870,179 B2* | 3/2005 | Shaheed et al. | ................ | 257/29 |
| 2004/0113217 A1 | 6/2004 | Chidambarrao et al. | | |
| 2004/0135234 A1* | 7/2004 | Morin et al. | ................. | 257/635 |
| 2004/0235236 A1* | 11/2004 | Hoffmann et al. | ............ | 438/231 |
| 2005/0059228 A1* | 3/2005 | Bu et al. | ...................... | 438/595 |
| 2005/0263825 A1* | 12/2005 | Frohberg et al. | ............ | 257/369 |
| 2006/0017098 A1 | 1/2006 | Doczy et al. | | |
| 2006/0024879 A1* | 2/2006 | Fu et al. | ...................... | 438/216 |
| 2006/0079046 A1* | 4/2006 | Yang et al. | .................. | 438/199 |
| 2006/0157750 A1* | 7/2006 | Kim et al. | ................... | 257/288 |
| 2006/0208250 A1 | 9/2006 | Sun et al. | | |
| 2008/0061366 A1 | 3/2008 | Liu et al. | | |
| 2008/0258227 A1 | 10/2008 | Wang et al. | | |

OTHER PUBLICATIONS

Chen, et al., "Extended Scaling of Ultrathin Gate Oxynitride toward Sub-65nm CMOS by Optimization of UV Photo-Oxidation, Soft Plasma/Thermal Nitridation & Stress Enhancement," 2004 IEEE, 2004 Symposium on VLSI Technology Digest of Technical Papers, pp. 176-177.

Ghani, T., et al., "A 90nm High Volume Manufacturing Logic Technology Featuring Novel 45nm Gate Length Strained Siicon CMOS Transistors," 2003 IEEE, IEDM, pp. 978-980.

(Continued)

*Primary Examiner*—Matthew E Warren
(74) *Attorney, Agent, or Firm*—Slater & Matsil, L.L.P.

(57) ABSTRACT

An N-MOS and/or P-MOS device having enhanced performance such as an FET suitable for use in a CMOS circuit. The device comprises both an "L-like" shaped layer or spacer on the side walls of a gate structure as well as a CESL (contact-etch stop layer) that covers the gate structure and surrounding substrate to induce increase tensile stresses in the N-MOS device and increased compressive stresses in the P-MOS device.

18 Claims, 7 Drawing Sheets

OTHER PUBLICATIONS

Iwamoto, T., et al., "A Highly Manfuacturable Low Power and High Speed HfSiO CMOS FET with Dual Poly-Si Gate Electrodes," 2003 IEEE, IEDM, pp. 639-642.

Kim, Y., et al., "Conventional poly-Si gate MOS-transistors with a novel, ultra-thin Hf-oxide layer," 2003 Symposium on VLSI Technology Digests of Technical Papers, pp. 167-168.

Mehrotra, M. et al., "60nm Gate Length Dual-Vt CMOS for High Performance Applications," 2002 IEEE, 2002 Symposium on VLSI Technology Digest of Technical Papers, pp. 124-125.

"Thin Film Hafnium Silicate (HFSiO) Thickness and Composition Measurements by XPS," HfSiO, Hafnium Silicate High-k Dielectric, Evans Analytical Group Application Note, 2004 Charles Evans & Associates, 2 pages.

* cited by examiner

CLOSED LOOP CESL HIGH PERFORMANCE CMOS DEVICE

TECHNICAL FIELD

The present invention relates to methods and structures for manufacturing high performance CMOS devices having stressed channels and more particularly to a fabrication process that combines an intrinsically stressed layer such as CESL (Contact-Etching Stop Layer), conformally coating the device and using an "L-like" shaped film that intrinsically provides compressive or tensile stresses to the substrate of a CMOS device.

BACKGROUND

As is well known by those skilled in the art, forming selected stresses in the channel regions of CMOS devices will enhance performance of the device. For example, parallel tensile stress in the channel region improves performance of an N-FET, whereas parallel compressive stress in the channel region enhances the performance of a P-FET.

Various techniques for creating the desired stress in the N-FET and P-FET portion of the CMOS device have been suggested. For example, Ghanni, et al., in a paper entitled "A 90 nm High Volume Manufacturing Logic Technology Featuring Novel 45 nm Gate Length Strained Silicon CMOS Transistors" (2003 IEDM, 11.6.1-11.6.3), discusses a post salicide "highly tensile" silicon nitride capping layer wherein the stress is transferred to the NMOS channel through the source/drain regions. A layer thickness of approximately 75 nm results in a 10% NMOS $I_{DSAT}$ gain.

U.S. Patent Publication 2004/0113217 A1 to Chidambarraco, et al. discloses a method of causing tension and/or compression on a substrate by the selection of an "L-like-"shaped layer of material formed adjacent sidewalls of a gate structure that is disposed above the channel regions. The "L-like" shaped layer of material is formed so that the two legs of the material are adjacent both the gate sidewalls and the substrate of the device such that stresses are formed on adjacent substrate areas. In addition, the material of the "L-like" shaped layer is selected so that the stresses are controlled or varied as necessary within both the N-FET and P-FET devices to improve the IC performance.

Papers by Y. Kim, et al. (2003 VLSI, pp. 639) and T. Iwamato, et al. (2003 IEDM, pp. 167) also disclose the use of "L-like" shaped SiN film and HfSiO or oxynitride gate dielectrics.

All of the above techniques provide some improvements to the performance of a CMOS device by inducing stress in the channel regions of the device. However, further increases in the performance of the device by further increasing the stress that can be induced in the channel regions would be advantageous.

SUMMARY OF THE INVENTION

These and other problems are generally solved or circumvented, and technical advantages are generally achieved, by preferred embodiments of the present invention, which provides increased stress to the channel regions of semiconductor devices.

To increase the stress induced in the channel regions of the semiconductor device, the present invention discloses structures and methods that result in two or more stress inducing techniques being combined into a single device or method to achieve higher induced stresses than were heretofore possible. According to the invention, a semiconductor device, such as for example only, a CMOS device comprises a substrate having at least one gate structure on the substrate. For CMOS devices, there will, of course, be at least one gate structure in both the N-region and the P-region of the substrate. Also included is at least one "L-like" shaped layer having a first leg of the L extending to a first end and a second leg of the L extending to a second end. According to one embodiment, the "L-like" shaped layer may be in direct contact with the substrate and the gate structure, or according to another embodiment, may include an oxide layer between the "L-like" shaped layer and the substrate and between the "L-like" shaped layer and the gate structure. There is also included at least one spacer formed over the "L-like" shaped layer such that the spacer is in contact with both the first and second legs of the "L-like" shaped layer. A layer of intrinsically stressed material covers the gate structure, the at least one "L-like" shaped layer and the spacers, as well as selected areas of the substrate. The intrinsically stressed layer is in contact with and may have bonds with the first and second ends of the "L-like" shaped layer. Although different materials may be used for the intrinsically stressed layer and the "L-like" shaped layer, to assure good bonding, these layers may preferably be made of the same material. As mentioned above, for a CMOS semiconductor device, there are included both NMOS regions and PMOS regions and the described structure is present in both regions. Typically, the intrinsically stressed layer, covering the structure and the "L-like" shaped layer may be a contact-etching stop layer (CESL). The intrinsically stressed cover layer of the present invention is capable of transferring stress to the "L-like" shaped layer in addition to transferring stress through the source and drain regions to the channel region. The intrinsically stressed layer such as CESL that is used for both the "L-like" shaped layer and the cover layer may be selected to either provide intrinsically compressive stresses or intrinsically tensile stresses. The intrinsically tensile stressed layers are typically used with respect to the NMOS regions to provide tensile stress in the channel regions of the NMOS device. On the other hand, the CESL or intrinsically stressed material is chosen to have an intrinsically compressive stress when the material is to be used with respect to the PMOS devices.

The present invention is also equally suitable for use with such semiconductor devices manufactured with high-k dielectrics. Another embodiment of the invention is one of either an NMOS or a PMOS device having the "L-like" shaped layer and the other one of the devices having an offset spacer that replaces the "L-like" shaped layer.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 4A:
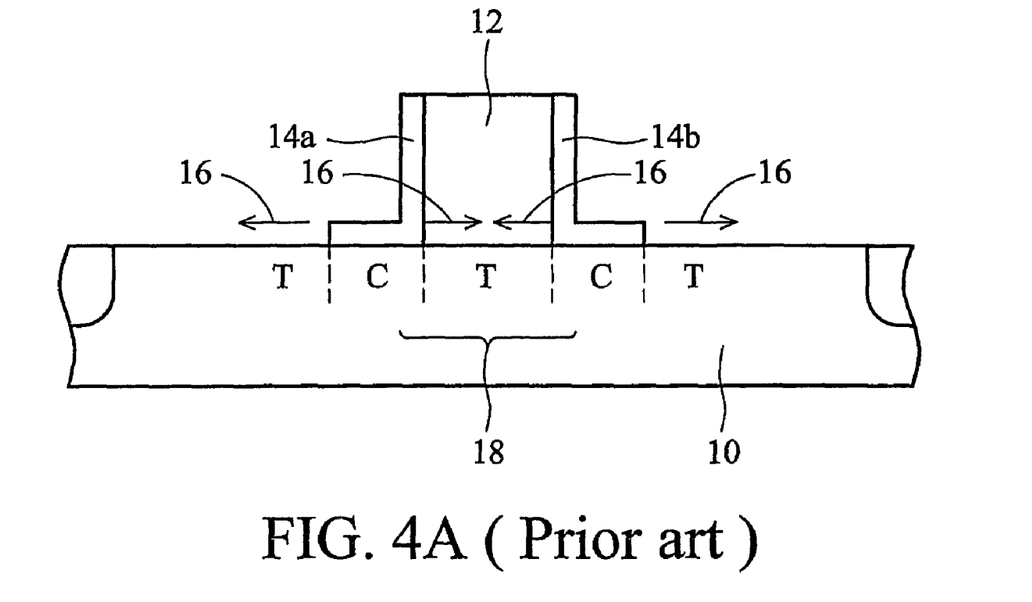
FIGS. 4A and 4B are prior art examples using an "L-like" shaped spacer to form stresses and channel regions of N-FET and P-FET devices.
Figure 4B:
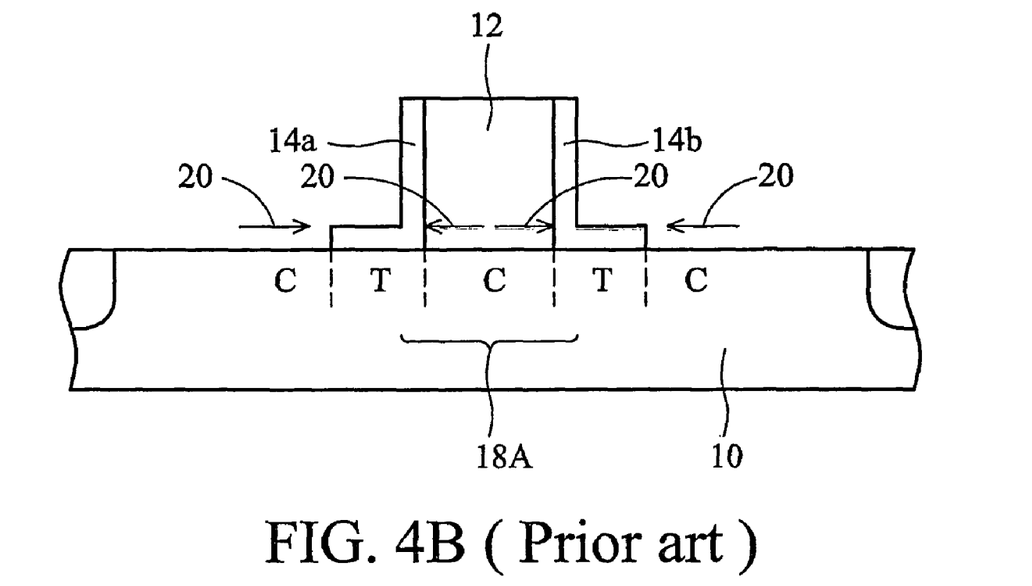
Figure 4C:
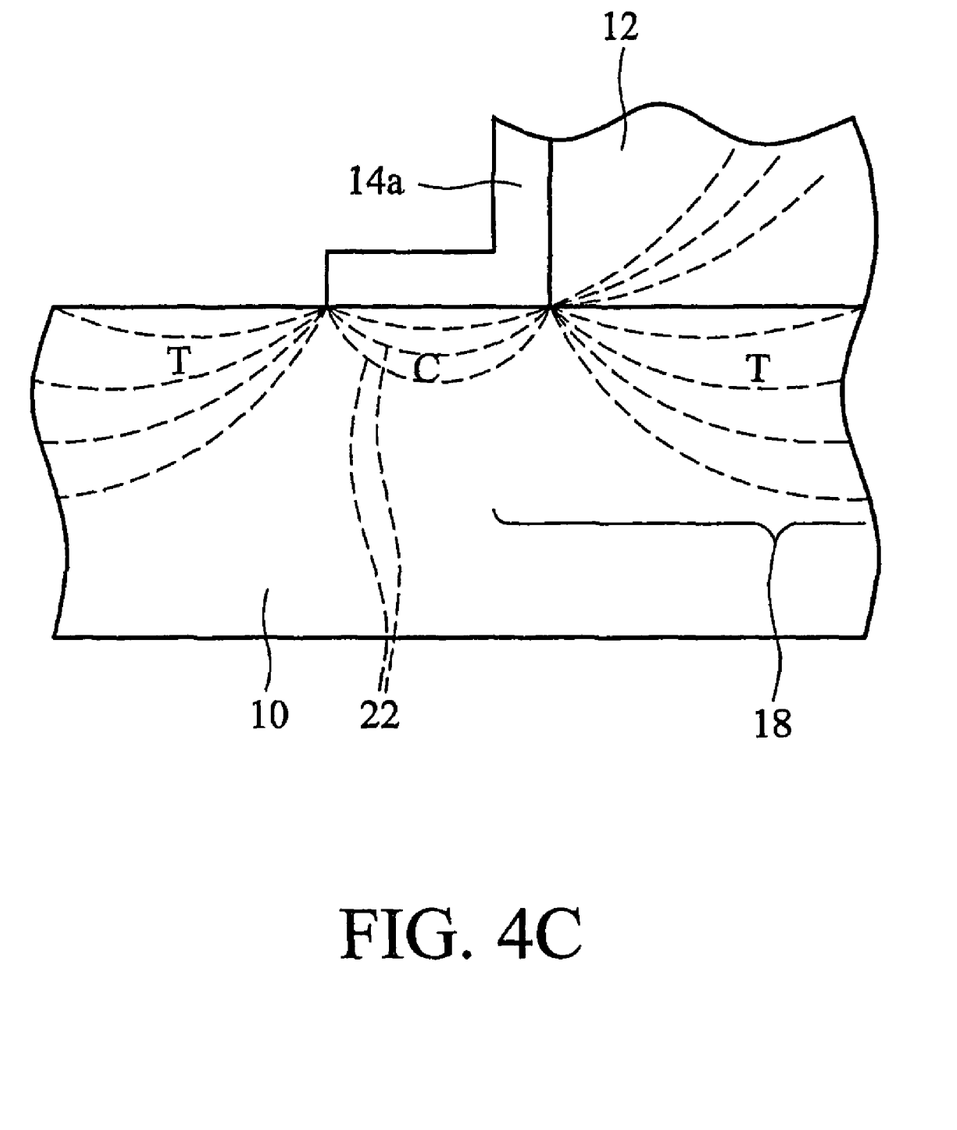
FIG. 4C shows the compressive stress line under the leg of the "L-like" shaped layer bonded to the substrate and the resulting tensile stress lines in the channel region under the gate and in the source drain region.

As was discussed above, "L-like" shaped regions have been used to provide stresses in the channel regions of CMOS devices. More specifically, as shown in the prior art FIGS. 4A and 4B, there are illustrated substrates 10, having a gate structure 12 and "L-like" shaped spacers 14a and 14b. The letter "C" indicates induced compressive stresses in the substrates 10, and the letter "T" indicates induced tensile stresses in the substrates. As will be appreciated by those skilled in the art, it is desirable to provide tensile stress in the channel regions under the gate for an NMOS device, while applying a compressive stress in the channel region for a PMOS device. As shown in FIG. 4A, arrows 16 extend away from the "L-like" shaped spacer 14a and 14b and indicate a material having an "intrinsic" tensile stress, and as indicated in the drawing, "L-like" shaped spacers made of a material with intrinsic tensile stress will result in compressive stresses below the spacer, which in turn results in tensile stress in the channel region 18 of the device. On the other hand as shown in FIG. 4B, arrows 20 pointing toward the "L-like" shaped spacer material indicate the "L-like" shaped spacers are made of a material having intrinsic compressive stresses. Such intrinsic compressive stresses in a material result in tensile stresses in the substrate directly below the spacers. This in turn results in compressive stress in the channel region 18a of a PMOS device. Thus, it will be appreciated that the "L-like" shaped spacers having a tensile intrinsic stress will produce a channel having tensile stress and a spacer having intrinsic compressive stress will produce channels having compressive stress. FIG. 4C illustrates the example of FIG. 4A for an NMOS device where the spacers 14a and 14b have an intrinsic tensile stress. As shown in FIG. 4C the "L-like" shaped spacer 14a shrinks (i.e. intrinsic tensile stress) and provides compressive stresses in the substrate 10 where the spacer 14a is attached or bonded to the substrate as is indicated by the stress lines 22 under the "L-like" shaped spacer. This compressive stress under the "L-like" shaped spacers in turn causes tensile stress to form on each side of the compressive stress including the channel region 18a under the gate structure 12. Of course, since as shown in the figure there is an "L-like" shaped spacer on each side of the gate structure, both the "L-like" shaped spacers 14a and 14b contribute to the tensile stress under the gate structures.

Figure 1A:
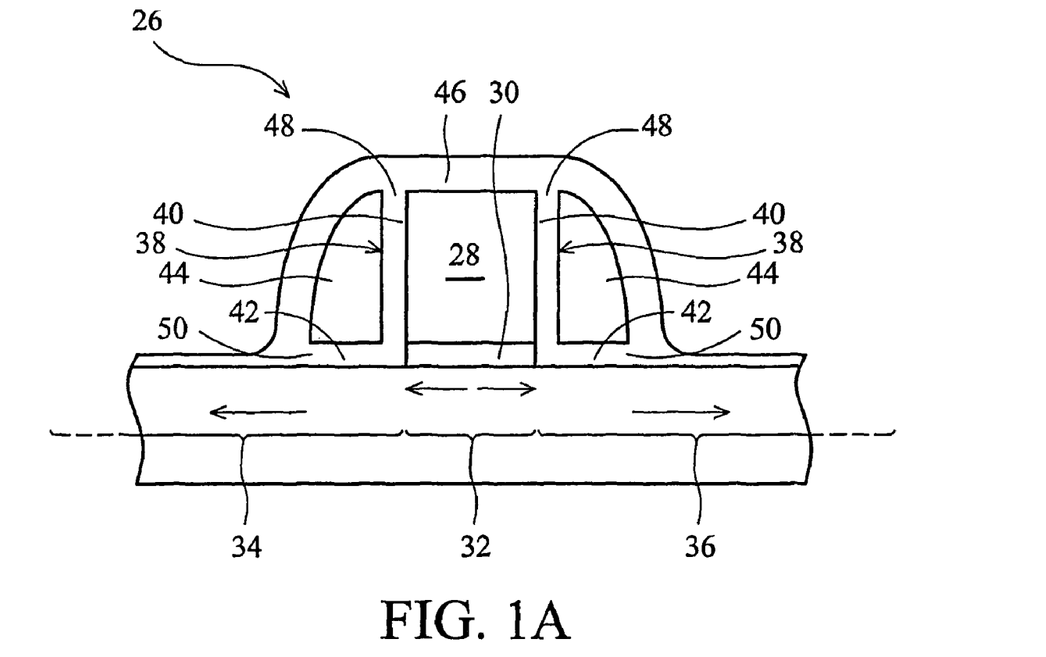
FIG. 1A illustrates an embodiment of the invention that produces a tensile stress in the NMOS channel region.

Referring now to FIG. 1A, there is illustrated a first embodiment of the invention for enhancing carrier mobility and device performance in an NMOS region of a CMOS device. As shown, there is an NMOS region 24 of a silicon substrate. A gate structure 26 includes a conductive gate electrode 28 typically formed from doped polysilicon and a gate dielectric 30 formed over a channel region 32 in the NMOS region 24. The gate dielectric 30 may comprise various known materials such as a silicon oxide, a silicon nitride, or a silicon oxynitride. Alternately, the gate dielectric 30 may comprise a high-k film having a dielectric constant of about 9 or greater such as for example a hafnium based high-k material ($Hf_xSi_yO_zN_w$) material, a zirconium based high-k film ($Zr_aSi_bO_cN_d$) material, or an aluminum based high-k film ($Al_eO_f$) material. Either a source region or a drain region 34 is formed on one side of the channel region 32, and the corresponding drain region or source region 36 is formed on the other side of the channel region 32. Also included with the gate structure 26 is at least one "L-like" shaped layer 38 having one leg 40 formed to be in contact with and lying along the gate dielectric 30 and the gate electrode 28. The other leg 42 of the "L-like" shaped layer is formed parallel to and in contact with the top surface of the NMOS portion of the substrate 54. The "L-like" shaped layer 38 is typically silicon nitride (SiN) film or the like having a thickness of less than about 25 nm. The "L-like" shaped film has intrinsic tensile stresses when the "L-like" shaped layer contracts or shrinks. Alternately, the "L-like" shaped layer may comprise a high-k film having a dielectric constant of about 5 or greater. Suitable materials include hafnium based high-k material, aluminum based high-k material, zirconium based high-k material, or transition metal based high-k material. A spacer 44 is formed over the "L-like" shaped layer by well known techniques so that it is in contact with both legs of the "L-like" shaped layers. The spacer 44 may comprise an oxide such as silicon oxide or silicon oxynitride ($SiO_xN_y$). Other suitable spacer materials include a layer of oxide followed by a layer of nitride (ON), a first layer of nitride followed by a layer of oxide (NO), or a layer of oxide, a layer of nitride, and another layer of oxide (ONO). A CESL (contact-etching stop layer 46) is then formed over the gate structure 26 and selected portions of the NMOS region 24 of the substrate.

The CESL film 46 covering the gate structure 26 and substrate is a layer or film having a high mechanical tensile stress such as silicon nitride (SiN) and preferably may be the same or a material substantially similar to the material used for the "L-like" shaped layer 38. Further, since the embodiment of FIG. 1A relates to an NMOS device, both the "L-like" shaped layer 38, and the CESL 46 covering the structure are selected to have intrinsic tensile stresses. However, as will be discussed below and with respect to other embodiments, the material for the "L-like" shaped layer 38 and the covering film of CESL 46 may be selected to have a wide range of intrinsic stress from tensile through no stress to compressive stresses.

Referring again to FIG. 1A and as was discussed above, the "L-like" shaped layer 38 and the CESL film are preferably made of the same or similar materials. Consequently, ends 48 and 50 of legs 40 and 42 of the "L-like" shaped layer 38 bonds or connects with the CESL 46 covering the gate structure 26 such that at least a portion of the stresses in the CESL 46 is transferred to the "L-like" shaped layer 38. Thus, the combined stress from the CESL 46 and "L-like" layer 38 results in increase stress in the channel 32 and source/drain regions 34 and 36 which means better current ($I_{on}$) and current ($I_{off}$) performance of the transistor.

This combined performance increase achieved by the present invention is greater than the sum of the performance increases achieved by the CESL 46 covering alone plus the performance increase achieved by the "L-like" shaped layer 38 alone. As discussed in the paper by T. Ghani, et al. the "ON" current $I_{on}$ compared to the "OFF" current $I_{off}$ achieves an enhanced value of between about 10-15% by using the stressed CESL covering 46 alone. Use of the "L-like" shaped stressed layer 38 alone on the side walls of a gate structure 38 achieves an enhanced $I_{on}$ to $I_{off}$ of about 5%. Thus, a summed or nominal enhancement value of between 15% and 20% (5% for "L" shaped layer plus 10%-15% for the CESL) is predictable. However, transferring additional stresses from the CESL through the "L-like" shaped layer and into the channel region by contacting or bonding the ends 48 and 50 of the legs 40 and 42 of the "L-like" shaped layer 38 to the CESL covering 46 results in an additional enhancement of about 3% or a significant total gain in the enhancement of over 28% (the 5% from the "L-like" shaped layer 38 discussed above plus an increase of about 23.6% from the CESL 46).

Figure 1B:
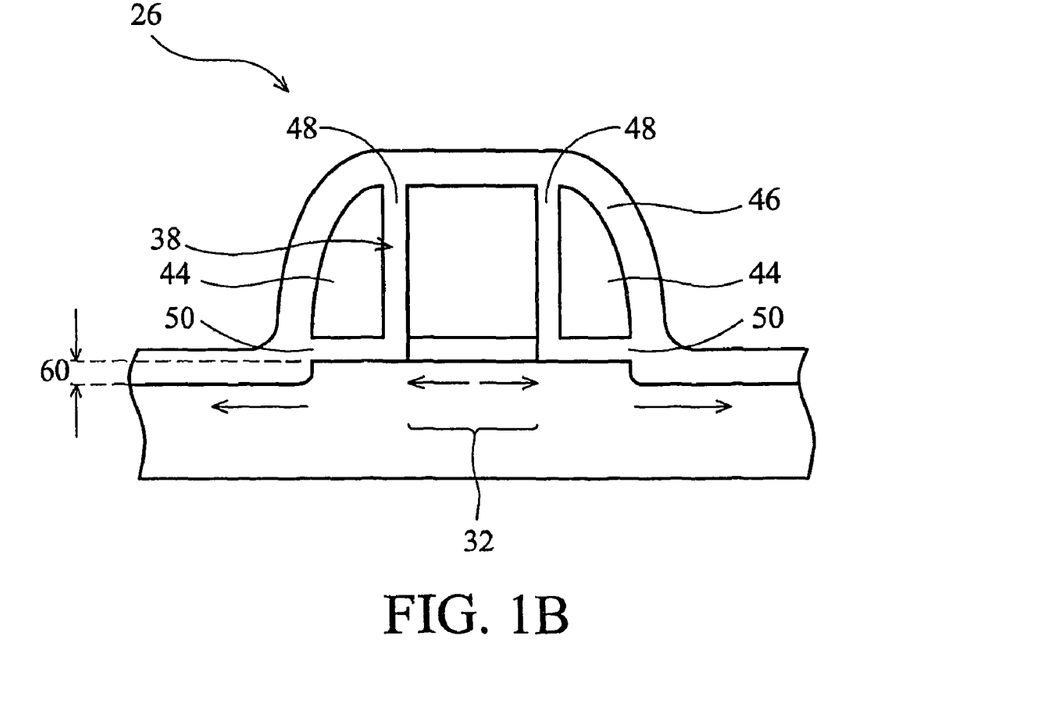
FIG. 1B is similar to FIG. 1A, except a recess is formed in the source/drain region of the substrate.
Figure 1C:
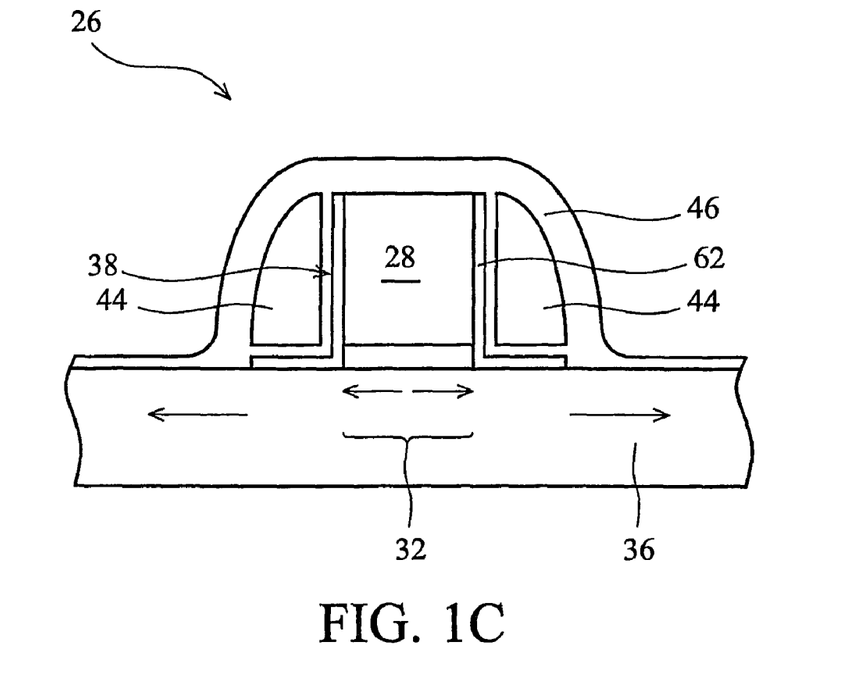
FIG. 1C illustrates another embodiment of the invention similar to FIG. 1A and further includes a thin oxide layer.

FIG. 1B is similar to FIG. 1A, except that a recess 60 of less than about 500 Å is formed in the source/drain substrate. FIG. 1C is also similar to FIG. 1A, except there is further included a thin "L-like" shaped film of oxide 62 between the "L-like" shaped layer 38 and the substrate 24 and between the "L-like" shaped layer 38 and the side walls of the gate structure 26. The oxide layer 62 provides a buffer layer against nitrogen diffusion and therefore prevents nitrogen concentration from affecting the device, source/drain, or pocket implant profile and is preferably a thermal oxide, a chemical oxide or a CVD oxide film having a thickness less than about 60 Å.

Figure 1D:
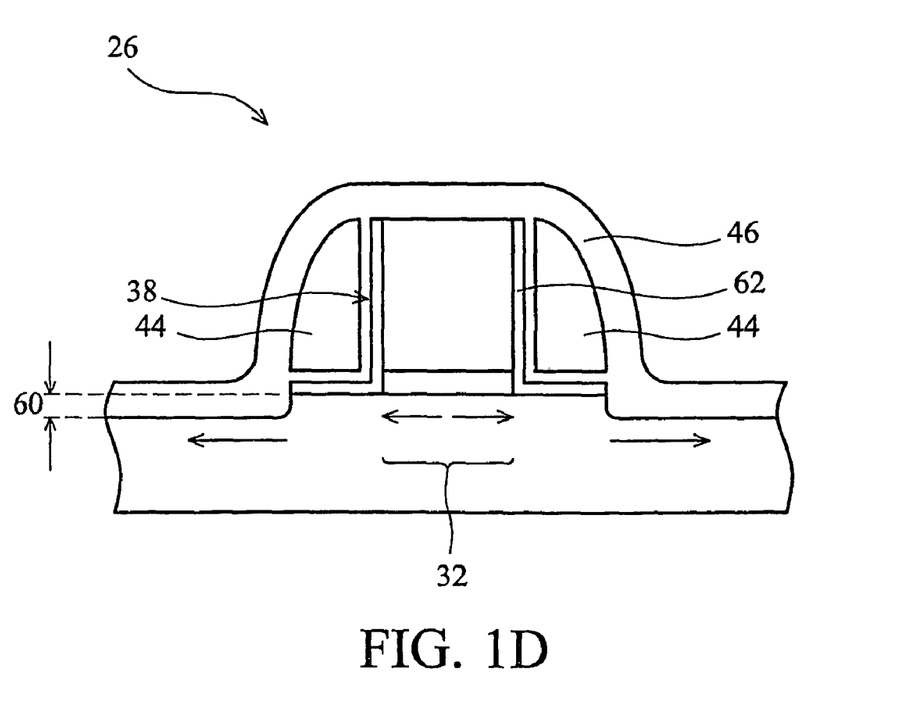
FIG. 1D illustrates yet another embodiment of the invention similar to FIG. 1B, except a recess is formed in the source/drain region of the substrate.

FIG. 1D includes recesses for the source/drain area and is similar to FIG. 1B, except that it also includes the shaped film oxide 62 of FIG. 1C.

As will be appreciated by those skilled in the art, the NMOS device discussed above experiences enhanced performance by increasing tensile stresses in the channel regions of the device. However, compressive stresses in the channel regions of a PMOS device are desired for similar performance enhancement.

Figure 2A:
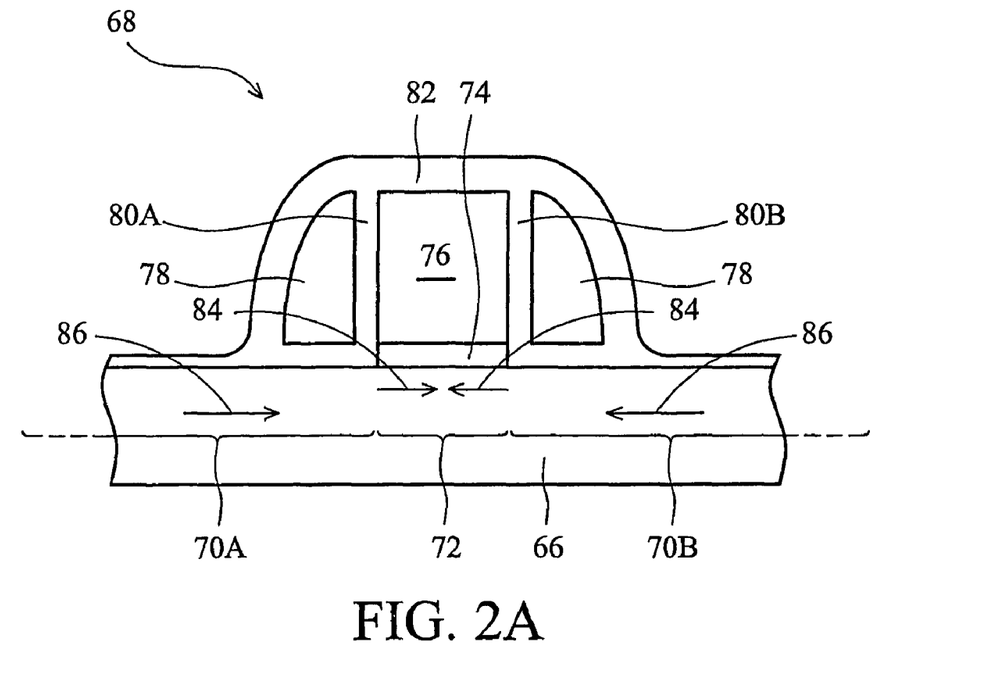
FIG. 2A illustrates another embodiment of the invention that produces compressive stresses in a PMOS channel region.

Therefore, referring to FIG. 2A, there is illustrated a PMOS device incorporating the features of the present invention. As shown, a PMOS region 66 of the substrate comprises a gate structure 68 formed over a first S/D area 70a, a channel region 72, and a second S/D region 70b. Also as indicated, the gate structure includes a gate oxide 74 and a gate electrode 76. The gate structure 68, the spacers 78 and the "L-like" shaped layers 80a and 80b are all covered with a CESL 82 over the gate structure 68 and the substrate 66. It will be appreciated that the structure of FIG. 2A is similar to that of FIG. 1A. However, unlike FIG. 1A, the "L-like" shaped layer material and the CESL material are selected to create compressive stresses in the channel region 72 of the device as indicated by double arrows 84. Compressive stress is also created in the S/D areas 70a and 70b as indicated by arrows 86.

Figure 2B:
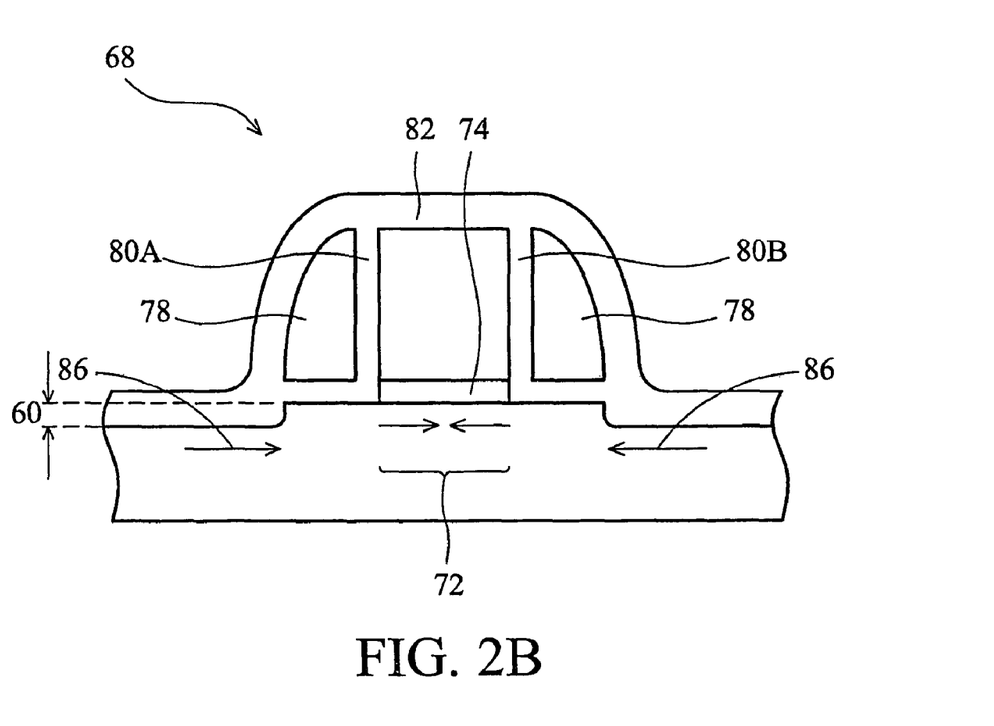
FIG. 2B is similar to FIG. 2A, except a recess is formed in the source/drain region of the substrate.
Figure 2C:
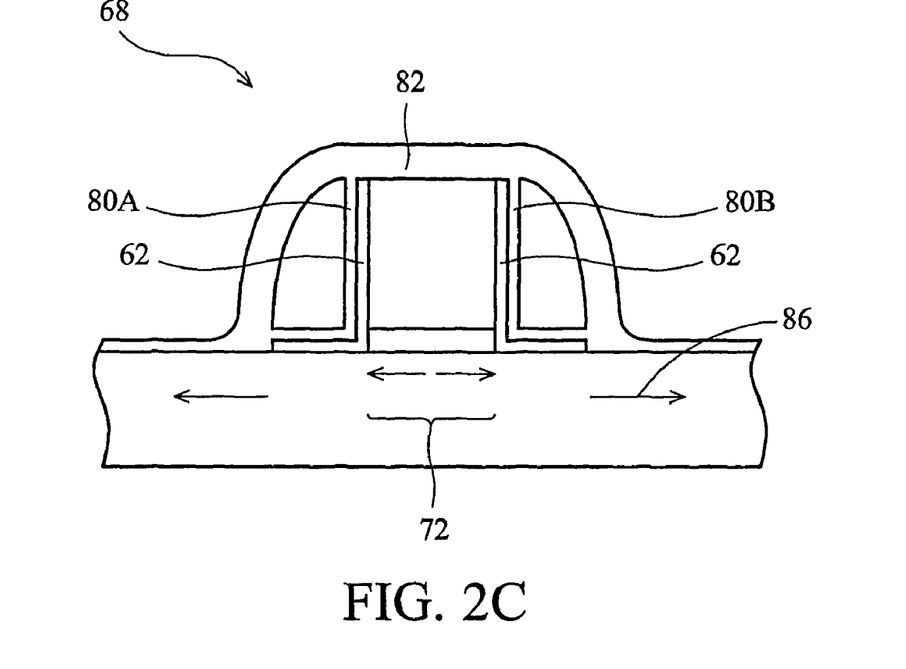
FIG. 2C is similar to FIG. 2A, and further includes a thin oxide layer.
Figure 2D:
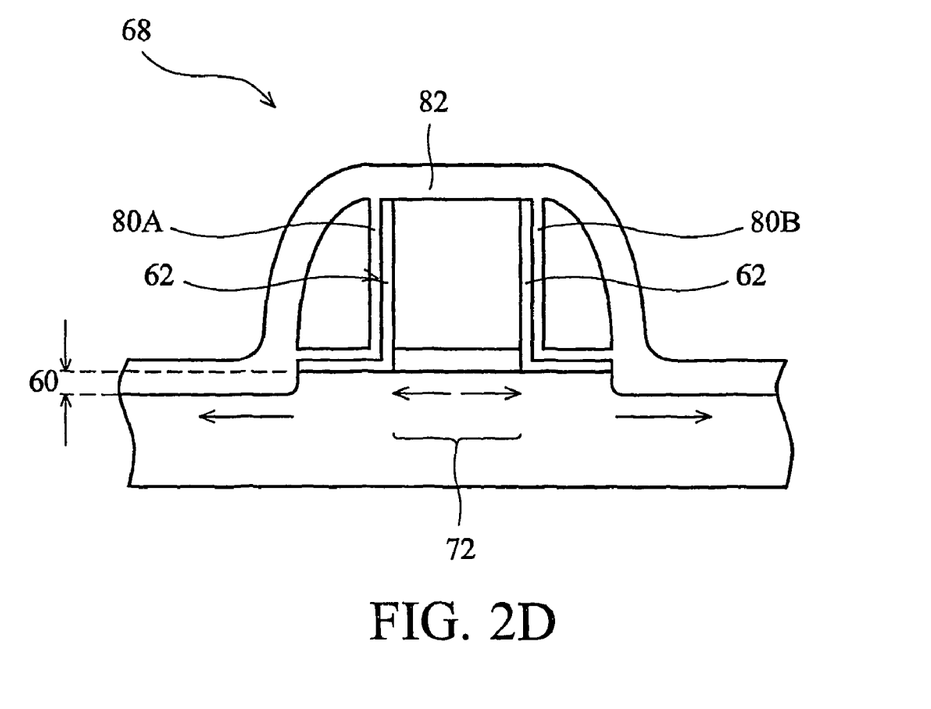
FIG. 2D is similar to FIG. 2B, except that a recess is formed in the source/drain region of the substrate.

Likewise, FIGS. 2B-2D represent PMOS devices that are similar to those NMOS devices discussed with respect to FIGS. 1B-1D except the "L-like" shaped layers and the CESL covering are chosen to create compressive stresses.

It will be appreciated that a CMOS device incorporating the teachings of the present invention will preferably comprise one or more of the NMOS devices of FIGS. 1A-1D and one or more of the PMOS devices of FIGS. 2A-2D. However, other CMOS device structures may be fabricated that use the enhanced NMOS device of the invention discussed with respect to FIGS. 1A-1D, but use an unenhanced PMOS device of the prior art. Similarly, a CMOS structure may use the enhanced P-MOS device of the invention but an unenhanced NMOS device of the prior art. Other CMOS structures using the present invention are also possible.

Figure 3A:
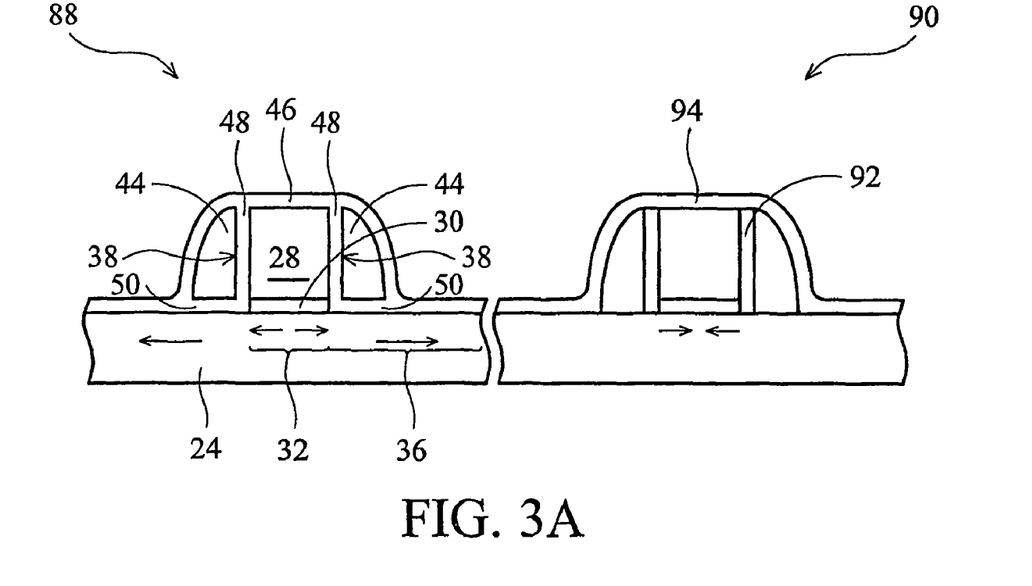
FIG. 3A illustrates yet another embodiment that includes a device similar to that of FIG. 1A that produces a tensile stress in the NMOS channel region and further includes a device with an offset spacer.

As an example only, FIG. 3A illustrates an NMOS device 88 of FIG. 1A according to the teachings of the present invention, whereas the PMOS device structure 60 uses an "offset spacer" 92 instead of the "L-like" shaped spacer layer. A CESL covering 94 over the structure 90 provides compressive stresses to channel region through the PMOS source and drain region.

Figure 3B:
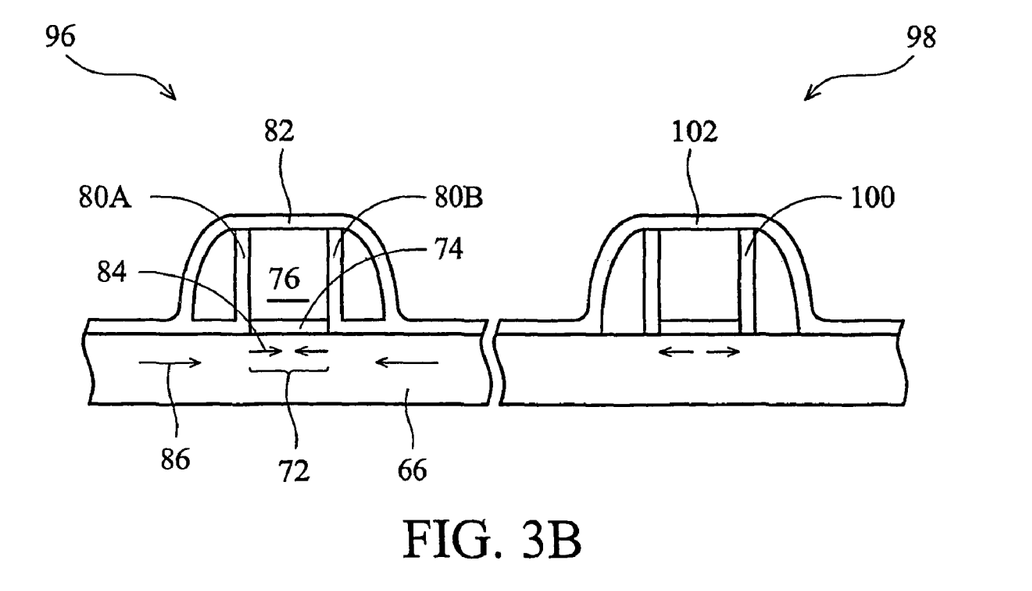
FIG. 3B illustrates another embodiment that includes a device similar to that of FIG. 1C that produces a compressive stress in the PMOS channel and further includes that a device with an offset spacer.

In a similar yet opposite manner, FIG. 3B illustrates a PMOS device 96 that incorporates the teachings of the present invention and includes an NMOS device 98 with an offset spacer 100 that replaces the "L-like" shaped layer. A tensile CESL 102 is used to cover the device and provide some tensile stress to the channel region.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a substrate with a recess formed in a source/drain region of said substrate;
   at least one gate structure on said substrate, the gate structure comprising a gate electrode;
   at least one "L-like" shaped layer having a first leg immediately adjacent to the gate electrode and extending to a first end along the gate electrode, and a second leg extending to a second end along said substrate, said at least one "L-like" shaped layer being formed of a single, metal-containing first material;

at least one spacer in contact with said first and second legs of said at least one "L-like" shaped layer; and an intrinsically stressed layer covering said at least one gate structure, said at least one "L-like" shaped layer, said at least one spacer, and selected areas of said substrate, said intrinsically stressed layer in contact with said first and second ends of said "L-like" shaped layer, the intrinsically stressed layer being formed of the single, metal-containing first material.

2. The device of claim 1 wherein said intrinsically stressed layer is a contact-etching stop layer (CESL) that transfers stress to said at least one "L-like" shaped layer.

3. The device of claim 1 wherein at least one of said intrinsically stressed layer and said at least one "L-like" shaped layer comprises a high-k dielectric.

4. The device of claim 1 wherein said intrinsically stressed layer selectively creates one of compressive or tensile stresses in said substrate below said at least one gate structure.

5. The device of claim 1 wherein at least one of said at least one "L-like" shaped layer and said intrinsically stressed layer has a dielectric constant "K" greater than 5.

6. The device of claim 1 wherein the thickness of said at least one "L-like" shaped layer is less than about 25 nm.

7. The device of claim 1 wherein said at least one "L-like" shaped layer selectively creates one of compressive or tensile stresses in said substrate below said at least one gate structure.

8. The device of claim 1 wherein said at least one spacer is formed from materials selected from the group consisting of silicon oxide, silicon nitride and silicon oxynitride.

9. The device of claim 8 wherein said at least one spacer comprises at least two layers of materials, and said at least two layers of materials are selected from a combination consisting of oxide/nitride (ON), nitride/oxide (NO), and oxide/nitride/oxide (ONO).

10. The device of claim 1 further comprising a gate dielectric between said substrate and said gate electrode.

11. The device of claim 10 wherein said gate dielectric is selected from the group consisting of silicon nitride, or silicon oxynitride.

12. The device of claim 11 wherein the "k" value of said high k gate dielectric is greater than about 9.

13. The device of claim 12 wherein said high k gate dielectric is selected from the group consisting of an Hf-based high-k material, a Zr-based high-k material, or an Al-based high-k material.

14. The device of claim 1 wherein said substrate is silicon.

15. The device of claim 1 wherein said recess is less than about 500 Å.

16. A semiconductor device comprising a substrate having a first recess and a second recess located within the substrate:

a first device on the substrate adjacent the first recess, the first device comprising a gate electrode, at least one "L-like" shaped layer in contact with the gate electrode, and a first spacer in contact with said at least one "L-like" shaped layer;

a second device on the substrate adjacent the second recess having at least one offset spacer and a second spacer in contact with said offset spacer; and an intrinsically stressed layer covering said first device, said second device, said first spacer, said second spacer and in contact with said at least one "L-like" shaped layer, said at least one "L-like" shaped layer and the intrinsically stressed layer being formed of only a metal-based high-k first material.

17. The device of claim 16 wherein said first device is an NMOS device and said second device is a PMOS device, and said intrinsically stressed layer is a tensile stressed film.

18. The device of claim 16 wherein said first device is a PMOS device and said second device is an NMOS device, and said intrinsically stressed layer is a compressive stress film.

* * * * *